United States Patent [19]

Shiba et al.

[11] Patent Number: 5,175,711
[45] Date of Patent: Dec. 29, 1992

[54] SURFACE ACOUSTIC WAVE APPARATUS AND METHOD OF PRODUCTIVITY AND ADJUSTMENT OF THE SAME

[75] Inventors: Takashi Shiba, Yokosuka; Yuji Fujita, Yokohama; Toshimitsu Takahashi, Sagamihara; Jun Yamada, Yokohama, all of Japan

[73] Assignee: Hitachi, Ltd., Tokyo, Japan

[21] Appl. No.: 842,570

[22] Filed: Jan. 2, 1992

Related U.S. Application Data

[63] Continuation of Ser. No. 413,722, Sep. 28, 1989, abandoned.

Foreign Application Priority Data

Oct. 3, 1988 [JP] Japan ................ 63-247343

[51] Int. Cl.⁵ .................. H04R 17/00; H03H 9/00
[52] U.S. Cl. .................. 367/140; 310/313 R; 310/313 D; 333/154; 333/194; 333/195
[58] Field of Search ............ 367/140, 164; 333/150, 333/154, 193, 194, 195; 310/313 R, 313 D

[56] References Cited

U.S. PATENT DOCUMENTS

| 3,716,809 | 2/1973 | Reeder et al. | 333/82 R |
|---|---|---|---|
| 4,144,507 | 3/1979 | Shreve | 333/191 |
| 4,155,057 | 5/1979 | Sandy et al. | 333/195 |
| 4,395,689 | 7/1983 | Feldmann et al. | 333/195 |
| 4,442,574 | 4/1984 | Wanuga et al. | 29/25.35 |
| 4,454,488 | 6/1984 | Hartmann | 333/194 |
| 4,463,327 | 7/1984 | Suzuki et al. | 333/194 |
| 4,635,009 | 1/1987 | Ebata | 333/195 |
| 4,760,360 | 7/1988 | Grassl et al. | 333/195 |

FOREIGN PATENT DOCUMENTS

| 0057555 | 8/1982 | European Pat. Off. |
| 2829538 | 7/1978 | Fed. Rep. of Germany . |
| 2531551 | 3/1984 | Fed. Rep. of Germany . |

OTHER PUBLICATIONS

Adrian J. Devries et al, "Case History of a Surface-Wave TV IF Filter for Color Television Receivers", *Proceedings of the IEEE*, vol. 64, No. 5, May 1976, pp. 671–676.
IEEE Trans. on Microwave Theory and Techniques, vol. MTT-21, No. 4, Apr. 1973, pp. 206–215.
IEEE, Trans. on Microwave Theory and Techniques, vol. MTT-21, No. 4, Apr. 1973, pp. 162–175.
IEEE, Trans. on Sonics and Ultrasonics, vol. Su-15, No. 2, Apr. 1968, pp. 111–119.

*Primary Examiner*—J. Woodrow Eldred
*Attorney, Agent, or Firm*—Antonelli, Terry, Stout & Kraus

[57] ABSTRACT

A surface acoustic wave apparatus wherein a reflector for reflecting a surface acoustic wave is provided on both sides of at least one of an input interdigital transducer and an output interdigital transducer, or, on one side of one of the input interdigital transducer and the output interdigital transducer.

7 Claims, 10 Drawing Sheets

SURFACE ACOUSTIC WAVE APPARATUS AND METHOD OF PRODUCTIVITY AND ADJUSTMENT OF THE SAME

This application is a continuation of application Ser. No. 413,722, filed Sep. 28, 1989, now abandoned.

BACKGROUND OF THE INVENTION

This invention relates to a surface acoustic wave apparatus and a method of production and adjustment of the same for providing superior skirt and out-of-band characteristics when used as a filter.

Conventional means for improving the skirt characteristic of the surface acoustic wave filter (the sharpness of the attenution characteristic at the edges of the frequency band of the filter) is a multistrip coupler which is described in, for example, IEEE Trans. on Microwave Theory and Techniques, Vol. MTT-21, No. 4, Apr. 1973, pages 206-215.

In the above prior art, in order to improve the skirt characteristic, it is necessary to increase the number of the interdigital transducer strips or fingers, and thus the chip size becomes large and the cost is inevitably increased. The relation between the skirt characteristic and the number of transducer strips is described in, for example, IEEE Trans. on Microwave Theory and Techniques, Vol. MTT-21, No. 4, Apr. 1973, pages 162-175.

Moreover, since the number of transducer strips must be increased in order to improve the skirt characteristic as described above, the radiation conductance of the interdigital transducer is increased, thus increasing the reflection which is determined by the conditions of the electrical load, or electrical reradiated wave (RW). Therefore, normally to suppress the reflection, the aperture of the interdigital transducer strips facing each other must be made narrow. In that case, the diffraction effect of the surface acoustic wave becomes more influential, causing the sidelobes of the filter characteristics to deteriorate.

SUMMARY OF THE INVENTION

It is an object of the invention to provide a surface acoustic wave apparatus which has a superior skirt characteristic, small size and small diffraction effect when used as a filter.

To achieve the above object, this invention provides a reflector for reflecting the surface acoustic wave, at least on one side of the interdigital transducer within a surface acoustic wave apparatus. In other words, the reflector for reflecting the elastic surface acoustic wave is provided at least on both sides of one of the input and output interdigital transducers or at least on one side of one of the input and output interdigital transducers.

The reflector provided on a side of the interdigital transducer reflects the surface acoustic wave radiated from the interdigital transducer, thereby bringing out such condition as if the number of sources of exciting the surface acoustic wave were apparently increased. Thus, the skirt characteristic can be improved without the increase of the number of interdigital transducer strips and hence without the increase of the chip size. Moreover, since the skirt characteristic can be improved without increasing the number of pairs of the interdigital transducer strips, there is no need to reduce the aperture between the transducer strips and the diffraction effect can be suppressed from being influential.

The prior art of a reflector used as a resonator is disclosed in, for example, IEEE Transactions on Sonics and Ultrasonics, Vol. SU-15, No. 2, Apr. 1968, pp. 111-119, but it cannot improve the skirt characteristic unlike the invention of this application.

DESCRIPTION OF THE PREFERRED EMBODIMENTS

Figure 1:
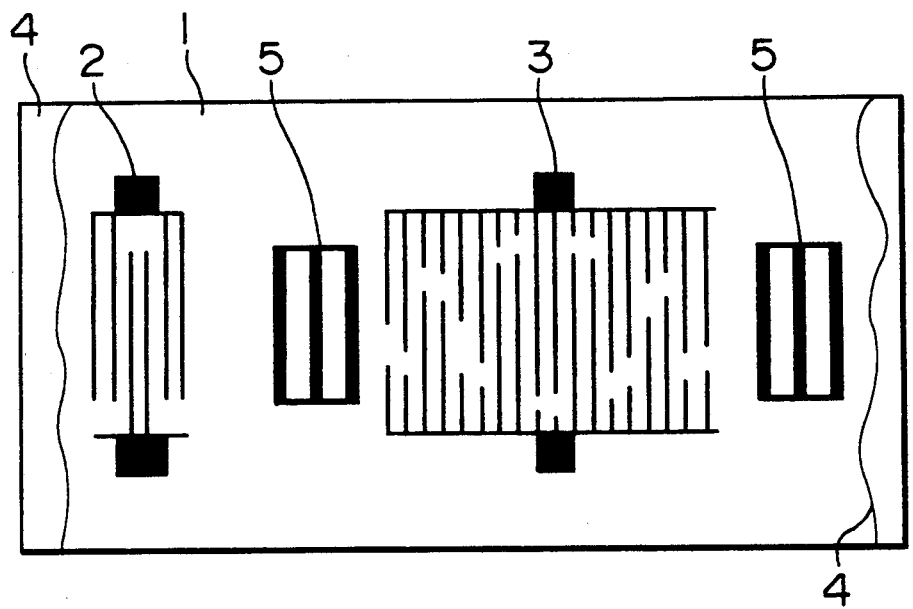
FIG. 1 is a schematic diagram of the first embodiment of a surface acoustic wave apparatus of the invention.
Figure 2:
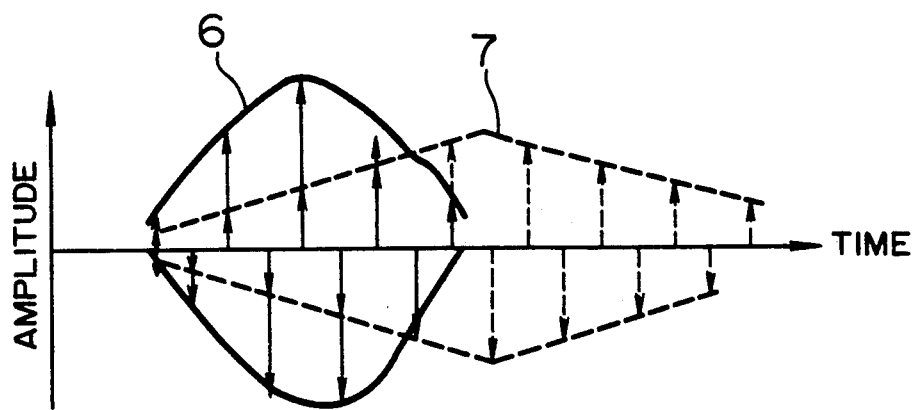
FIG. 2 is a diagram of an impulse response.

The first embodiment of the invention will be described with reference to FIGS. 1 to 3. FIG. 1 is a plan view of the first embodiment of a surface acoustic wave apparatus of the invention. There are shown a substrate 1 for the surface acoustic wave apparatus, an output interdigital transducer 2 and an input interdigital transducer 3, these transducers being formed on the substrate. Moreover, on the edges of the substrate 1 is coated an acoustical absorbent 4 for suppressing the reflection of the wave from the end surfaces of the substrate. On both sides of the input interdigital transducer 3 is disposed a reflector 5 of a short strip type. The input and output interdigital transducers 3 and 2 are of a split connection type.

The principle of the operation of this embodiment will be described with reference to FIG. 2. In FIG. 2, the abscissa is time, and the ordinate is the strength (amplitude) of an elastic surface acoustic wave exciting source. FIG. 2 schematically shows the impulse response viewed from a location which is separated from the interdigital transducers. The response indicated by a solid line 6 is of the input interdigital transducer itself (thus, the reflector 5 is not disposed), and the response indicated by a broken line 7 is of the transducer with the reflector 5. The impulse caused from the input interdigital transducer 3 is confined within the reflector 5, and part thereof is passed through the reflector 5 and reaches the output interdigital transducer 2. Thus, the impulse response train (broken line 7) is longer in response time than the impulse response train (solid line 6) without the reflector 5, and it is equivalent to the condition in which the interdigital transducer corresponding to the length of the response time is provided. Since there is no increase of the number of strips of the interdigital transducer, there is no need to decrease the aperture between the strips because the number of strips of the transducer is not required to increase. Therefore, the surface acoustic wave apparatus has a small size and an excellent skirt characteristic with small diffraction effect (see FIG. 3).

Figure 3:
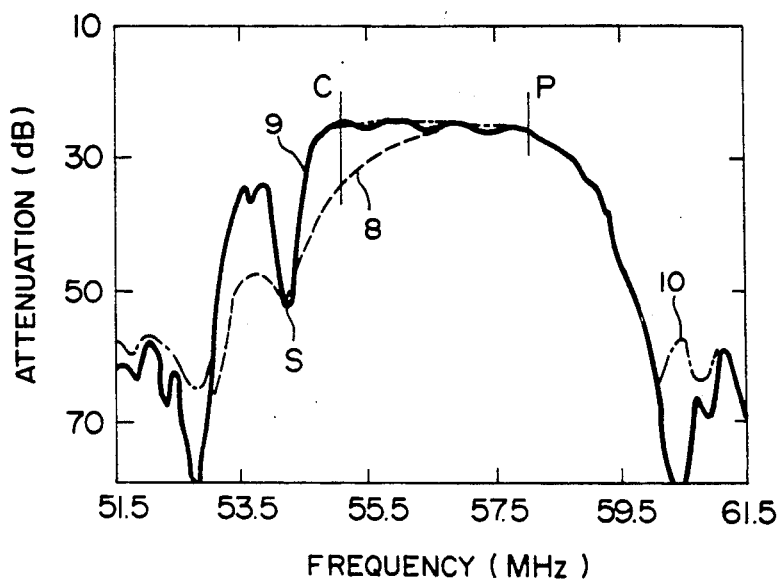
FIG. 3 is a diagram of the frequency-attenuation characteristic of the first embodiment of the invention.

FIG. 3 shows the frequency-attenuation characteristic of the surface acoustic wave apparatus of the first embodiment used as an IF filter of a television receiver for use in this country. In FIG. 3, the broken line 8 indicates the characteristic of the normal IF filter, and the one-dot chain line 10 indicates the characteristic of the conventional IF filter in which the number of strip pairs of the transducer is increased to improve the skirt characteristic of the chroma-tilt portion and to make the aperture narrow for reducing the reflection of RW. In the conventional IF filter, the number of pairs of exciting sources (impulses) of the input weighted interdigital transducer is 150, the aperture is 750 μm, the number of pairs of the output normal-type transducer is 15, the aperture is 1,500 μm, and the surface acoustic wave substrate 1 is an X-cut, 112-degree rotated Y-axis propagation LiTaO$_3$ substrate. This conventional structure has poor sidelobe and trap (attenuation pole) characteristics as shown in FIG. 3. The solid line 9 in FIG. 3 indicates the characteristic of the filter of this invention. The number of pairs of exciting sources of the input interdigital transducer 3 is 60, the aperture is 1,000 μm, and the number of transducer strips of the reflector 5 is 20. Therefore, the number of pairs of the input transducer including the reflector is about 80, which is substantially half the number of pairs, 150, of the conventional filter mentioned above. The number of pairs of the output normal-type interdigital transducer and the aperture are the same as in the conventional transducer. The total length of the chip is reduced to about $\frac{3}{4}$ as small as the conventional one. Moreover, since the aperture of the input interdigital transducer is not made narrow, the diffraction effect is suppressed so that an excellent out-of-band characteristic can be obtained. In FIG. 3, P indicates the carrier frequency (58.75 MHz) of the video signal, C is the sub-carrier frequency of the chrominance signal (55.17 MHz) and S is the sub-carrier frequency of the audio signal (54.25 MHz).

From the characteristic of the solid-line curve in FIG. 3, it will be seen that the skirt characteristic and the out-of-band characteristic are satisfactory, but a ripple appears within the band. This ripple is due to the effect of the reflection from the reflector 5.

The second embodiment of this invention in which the reflection is suppressed will be described with reference to FIGS. 4 and 5.

Figure 4:
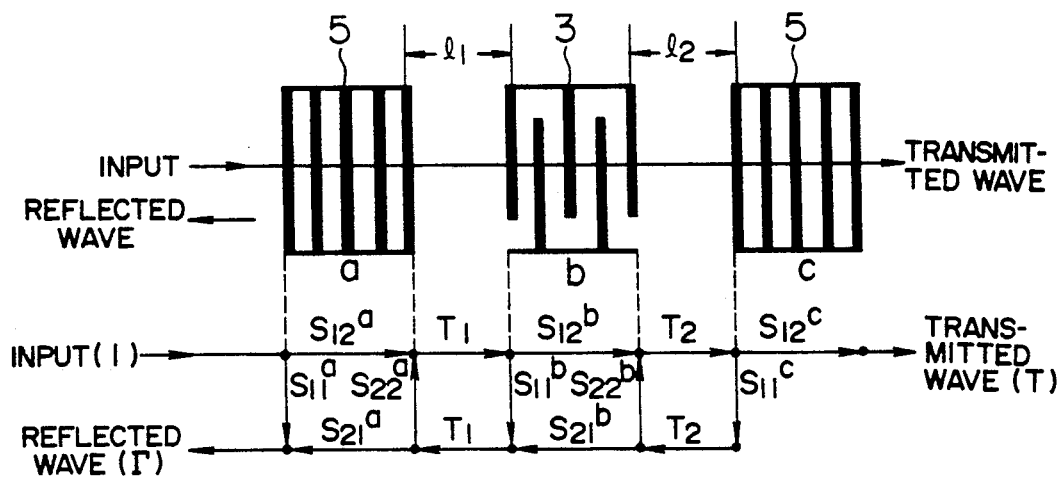
FIG. 4 is a diagram useful for explaining the method of analyzing the reflected wave in the second embodiment of a surface acoustic wave apparatus of the invention.

FIG. 4 shows the method of finding the total magnitude (if the input is 1, the reflection coefficient is Γ) of the reflected wave in the case where the reflector 5 is disposed on both sides of the input interdigital transducer 3 (as illustrated in the schematic plan view in the upper portion of FIG. 4 and in the equivalent circuit in the lower portion of FIG. 4). In FIG. 4, S is the element of the scattering matrix of the interdigital transducer and the reflector (the input port is represented by 1, and the output port by 2), and T1, T2 is the transmission coefficient between the reflector 5 and the input interdigital transducer 3. In FIG. 4, the suffix a indicates the value associated with the preceding reflector, b the value associated with the interdigital transducer, and c the value associated with the following reflector. The result of calculation is as follows:

$$\Gamma = S^a_{11} + \frac{T_1^2 S^a_{12} S^a_{21} \{S^b_{11}(1 - T_2^2 S^c_{11} S^b_{22}) + T_2^2 S^b_{12} S^c_{11} S^b_{21}\}}{1 - T_2^2 S^c_{11} S^b_{22} - \{S^b_{11}(1 - T_2^2 S^c_{11} S^b_{22}) + T_2^2 S^b_{12} S^c_{11} S^b_{21}\} T_1^2 S^a_{22}} \quad (1)$$

Moreover, for the purpose of reference the transmission coefficient T is given as $$T = \frac{T_1 T_2 S^a_{12} S^b_{12} S^c_{12}}{1 - T_2^2 S^c_{11} S^b_{22} - \{S^b_{11}(1 - T_2^2 S^c_{11} S^b_{22}) - T_2^2 S^b_{12} S^c_{11} S^b_{21}\} T_1^2 S^a_{22}} \quad (2)$$

If the condition for the canceling out of reflected waves at around the center frequency of the filter is expressed as $$T_1 = T_2 = e^{-j\frac{\pi}{2}} = \pm j \quad (3)$$

Each dispersion matrix is assumed to be a real number (since at around the center frequency each phase term can all be included in T1, T2), each reflector and the interdigital transducer are considered to have the property of reversibility and symmetry ($S_{12}=S_{21}$, $S_{11}=S_{22}$), the preceding reflector and the following reflector are assumed to be of the same construction, and the following expressions are assumed to be satisfied.

$$s^a{}_{11} = S^c{}_{11} = r_a \quad (4)$$

$$S^a{}_{12} = S^c{}_{12} = t_a \quad (5)$$

$$S^b{}_{11} = r_b \quad (6)$$

$$S^b{}_{12} = t_b \quad (7)$$

where r is the reflection coefficient and t is the transmission coefficient. Then, equation (1) can be expressed as $$\Gamma = r_a - \frac{t_a^2 \{r_b + r_a(r_b^2 - t_b^2)\}}{1 + r_a r_b + \{r_b + r_a(r_b^2 - t_b^2)\} r_a} \quad (8)$$

Since the loss of the reflectors and interdigital transducer is small, the following expressions can be satisfied by the energy conservation law.

$$r_a^2 + r'^2_a = 1 \tag{9}$$

$$r_b^2 + r'^2_b = 1 \tag{10}$$

Thus, equation (8) is given as $$\Gamma = \frac{r_b^2(4r_a^3 - 2r_a) + r_b(3r_a^2 - 1) + 2r_a - 2r_a^3}{1 + 2r_a r_b - r_a^2(2r_b^2 - 1)} \tag{11}$$

Since $\Gamma = 0$ under no reflection, by solving the quatratic equation $$r_b^2(4r_a^3 - 2r_a) + r_b(3r_a^2 - 1) + 2r_a - 2r_a^3 = 0 \tag{12}$$

it is possible to obtain the following relationship, $$r_b = \frac{1 - 3r_a^2 - \sqrt{32r_a^6 - 39r_a^4 + 10r_a^2 + 1}}{4r_a(2r_a^2 - 1)} \tag{13}$$

In other words, by determining the reflection coefficients of the interdigital transducer and reflectors, and by fixing the center-to-center distances $l_1$, $l_2$ between the edge strips of the interdigital transducer and the edge strips of the reflectors to $$\frac{1}{4}\lambda + \frac{n}{2}\lambda$$

($\lambda$ is the wavelength of the surface acoustic wave at the center frequency of the band, and n is a natural number).

$$(\text{or } T_1 = T_2 = e^{\pm j\frac{\pi}{2}})$$

it is possible to suppress the reflected waves.

Description will be made of the case when the surface acoustic wave apparatus of the second embodiment of this invention is used for the IF filter of the television receiver in this country. The input interdigital transducer is the solid, normal-type electrode, and a $\lambda/4$ solid, short strip-type reflector is provided on both sides of the input interdigital transducer. The number of pairs of exciting sources of the normal-type transducer is 15 (31 transducer strips), and the number of strips of the reflector is 16. The output side interdigital transducer is of the aperture weighted split connection type configuration, and the number of pairs of exciting sources is 60.5. Thus, $r_a = 0.108$ and $r_b = 0.054$, substantially satisfying the equation (13). The distance between the reflector and the transducer is $\frac{3}{4}\lambda$ (the center-to-center distance between the end transducer strips).

Figure 5:
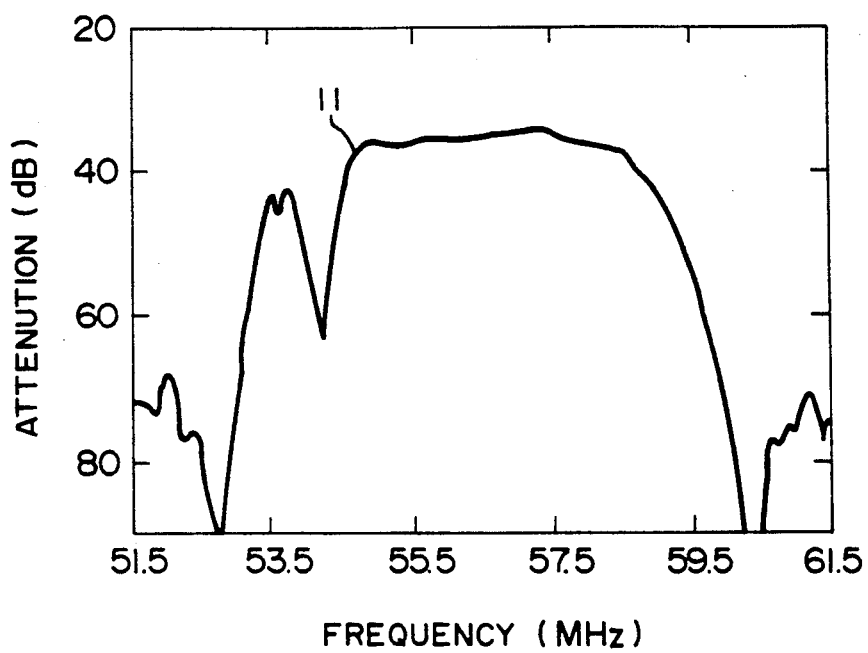
FIG. 5 is a diagram of the frequency-attenuation characteristic of the second embodiment.

FIG. 5 shows the frequency-attenuation characteristic of the second embodiment. The solid line 11 shows the amount of attenuation. From FIG. 5 it will be understood that the reflection characteristic within the band is improved and that the ripple is reduced. Thus, the second embodiment can provide a small-sized filter with small ripple at around the center frequency and with a better skirt characteristic.

Thus, in the second embodiment, the ripple characteristic can be improved at around the center frequency by specifying the reflection coefficient of the reflector.

As is obvious from FIG. 5, the degree of suppressing the reflected waves is reduced so that the ripple is increased, as the frequency becomes distant from the center frequency. This is why the phase rotation of $T_1$, $T_2$ is so fast as not to satisfy $$T_1, T_2 = e^{\pm j\frac{\pi}{2}}.$$

constant since the center-to-center distance of the reflector and the interdigital transducer is distant, thus the reflection is suddenly increased when the frequency is separated away from the center frequency.

The third embodiment can obviate the above defect. If $r_a$ and $r_b$ are sufficiently small relative to 1, the equation (13) is reduced to $$r_b \approx 2r_a \tag{14}$$

The reflection due to the difference of characteristic impedance between the solid-type short strip reflector and the solid-type interdigital transducer against the surface wave, or the reflection (MEL) determined by the geometrical shape of the transducer can be expressed as $$|\Gamma| = \left| \frac{Z_r^{2N} - 1}{Z_r^{2N} + 1} \right| \tag{15}$$

where $Z_r$ is the ratio of the propagation impedance between the presence of the transducer and the absence of the transducer against the surface acoustic wave, and N is the number of the strips of transducer. In general, since $Z_r$ is very close to 1, it is expressed as $$Z_r = 1 + \epsilon (\epsilon < 1) \tag{16}$$

Equation (15) is expressed as $$|\Gamma| \approx \left| \frac{2N\epsilon}{2 + 2N\epsilon} \right| \tag{17}$$

When $|\Gamma|$ is much smaller than 1 (N is small), it is reduced to $$|\Gamma| \approx N\epsilon \tag{18}$$

When the result of equation (18) is applied to the reflector (subscript a) and the interdigital transducer (subscript b), and equation (14) is used, the following relationship can be obtained.

$$N_b \epsilon \approx 2N_a \epsilon$$

$$N_b \approx 2N_a \tag{19}$$

In other words, when the number of transducer strips is sufficiently small, the ratio of the numbers of transducer strips of the reflector and the interdigital transducer is selected to be 1:2, thereby suppressing the total reflection. For example, for suppressing the reflection in the interdigital transducer of a pair of exciting sources, reflectors of one strip each are disposed to be separated $\frac{1}{4}\lambda \sim \frac{n}{2}\lambda$ (n is a natural number) away from both sides of the source, respectively. Thus, if n=1, the reflection can be suppressed sufficiently over a wide range of frequency.

Figure 6:
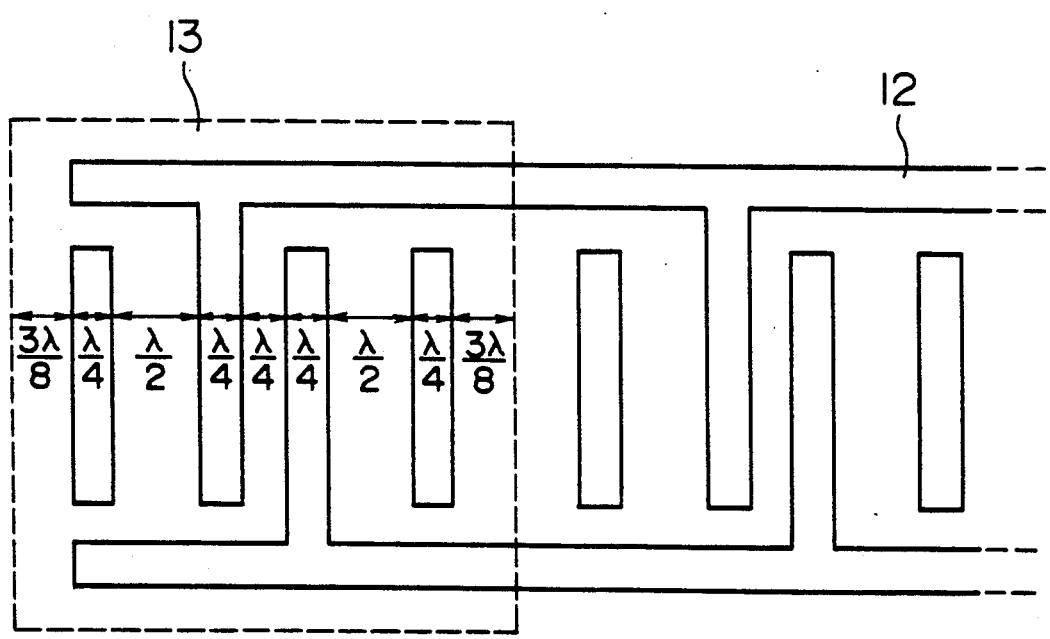
FIG. 6 is a schematic diagram of part of the third embodiment of a surface acoustic wave apparatus of the invention.

This group of transducer strips (a pair of exciting sources of the interdigital transducer and reflectors of one strip each (one set)) is used as a fundamental unit, and a plurality of these units are arranged in the surface acoustic wave propagation direction to achieve a desired frequency characteristic. FIG. 6 shows this structure as the third embodiment. The interdigital transducer 12 is formed of a plurality of fundamental units each of which is shown as the portion 13 surrounded by a broken line, and which are arrayed in the direction of the surface acoustic wave. In this structure, the reflection characteristic of the reflector has the problem that the equivalent reflection surface is slightly shifted because the MEL and the RW are superimposed. This problem can be solved by the structure of the fourth embodiment shown in FIG. 7.

Figure 7:
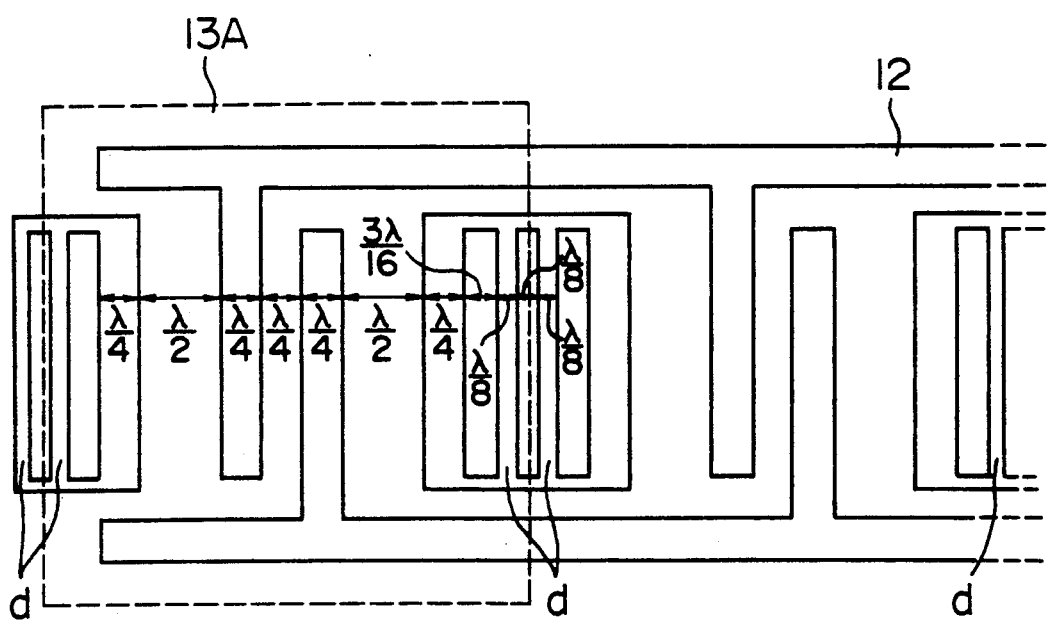
FIG. 7 is a schematic diagram of part of the fourth embodiment of a surface acoustic wave apparatus of the invention.

In FIG. 7, the electrode strip d disposed between the fundamental units 13A is used for removing the RW component of the reflector. The reason for the split type of electrode d is to suppress the MEL component. Thus, the interdigital transducer 12 has reflectors provided inside itself.

Figure 8:
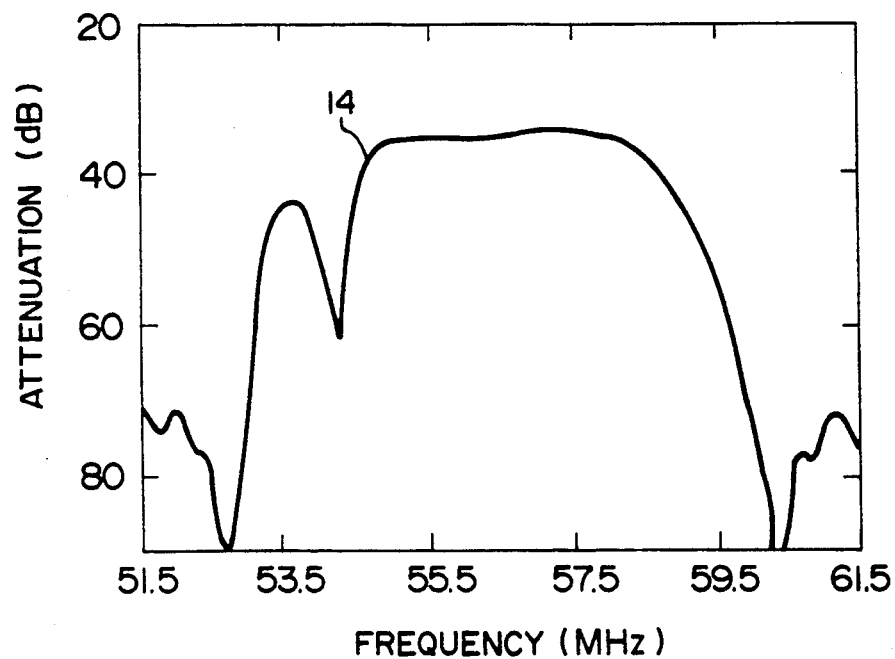
FIG. 8 is a diagram of the frequency-attenuation characteristic of the fourth embodiment.

Description will be made of the case where the surface acoustic wave apparatus having the input interdigital transducer of the same structure as the fourth embodiment is used as the IF filter of the television receiver of this country. The interdigital transducer having 5 fundamental units 13A connected is used as the input normal-type interdigital transducer, and the output interdigital transducer used is of the aperture weighted split connection type. The aperture of the input normal-type transducer is 1,500 μm, the number of pairs of exciting sources of the output interdigital transducer is 120, and its aperture is 1,000 μm. The frequency-attenuation characteristic of the filter is shown in FIG. 8 by a solid line 14. The ripple is reduced because the reflected waves are suppressed over a wide frequency range. Thus, according to the fourth embodiment, it is possible to produce a small-sized surface acoustic wave filter of which the skirt characteristic is better with the ripple suppressed over a wide frequency range.

Figure 9:
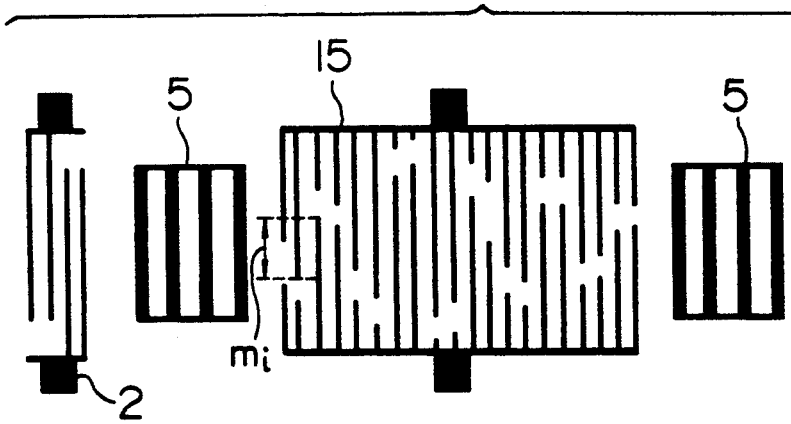
FIG. 9 is a schematic diagram of the fifth embodiment of a surface acoustic wave apparatus of the invention.
Figure 10:
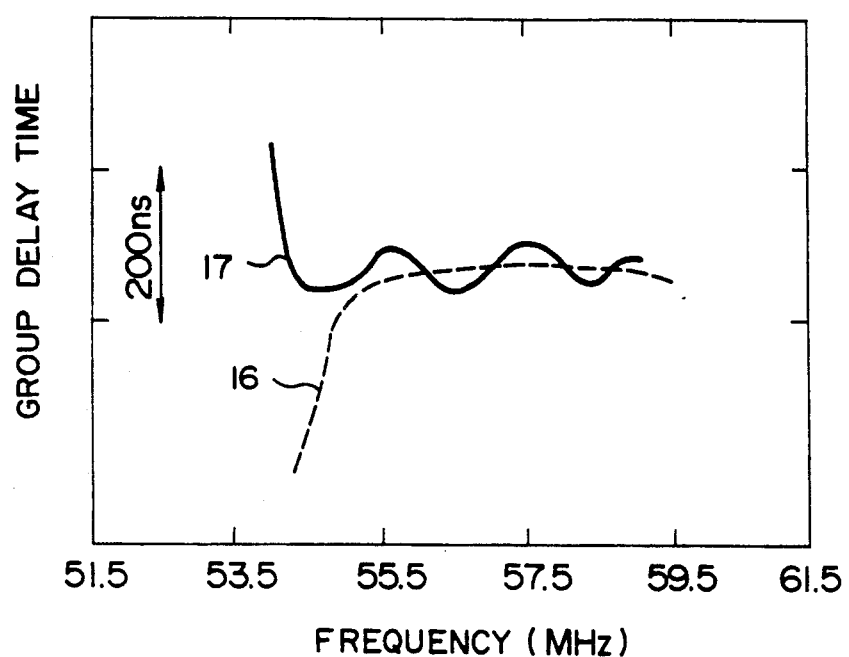
FIG. 10 is a diagram of the frequency-group delay characteristic of the fifth embodiment.

The fifth embodiment will be described with reference to FIGS. 9 and 10. FIG. 9 schematically shows the surface acoustic wave apparatus of the fifth embodiment. Relative to the output (input) interdigital transducer 2 is provided an input (output) interdigital transducer 15, on both sides of which are disposed the reflectors 5, respectively, as in previous embodiments. The provision of the reflectors confines energy between the reflectors, thereby improving the skirt characteristic. At the same time, since Q is increased at the frequencies of the ends of the frequency band, the group delay time is increased at the frequencies. In order to make the characteristic of group delay time flat, it is necessary to previously advance the phase in the group delay time characteristic of the interdigital transducer 15. FIG. 10 shows the group delay time characteristic of the fifth embodiment. The broken line 16 indicates the curve with no reflector, and the solid line 17 shows the curve with reflectors. From this graph, it will be seen that the group delay time is constant with respect to all the frequencies of the band. This is attributed to the fact that the length $m_f$ of the overlap of the transducer strips of the interdigital transducer 15 is made different with respect to the left and right in the propagation of the surface acoustic wave. Thus, according to the fifth embodiment, it is possible to produce a high-performance filter with small size, steep skirt characteristic and constant group delay.

The sixth embodiment will be described with reference to FIGS. 11 and 12. As can be seen from FIG. 10, the fifth embodiment cannot make the group delay completely constant, with the result that a ripple occurs in the frequency band. This is why the reflector is formed of many strips, causing energy to be confined within the reflectors with the result that the total impulse response is not symmetrical on the timebase. In order to further make the group delay time flat, a completely reflecting surface is necessary.

Figure 11:
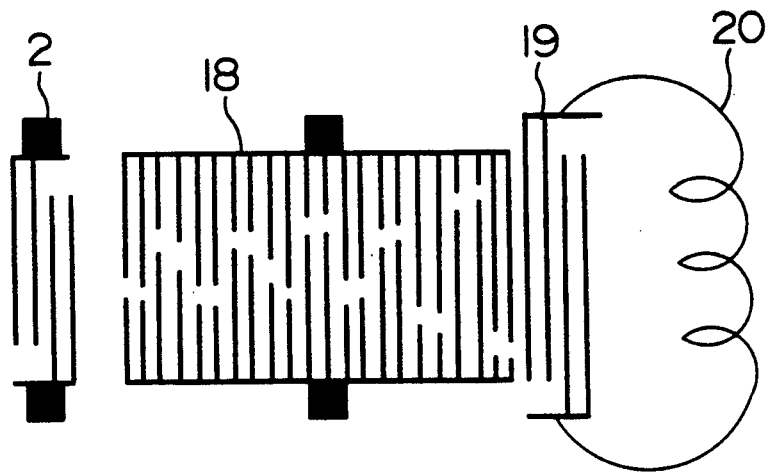
FIG. 11 is a schematic diagram of the sixth embodiment of a surface acoustic wave apparatus of the invention.
Figure 12:
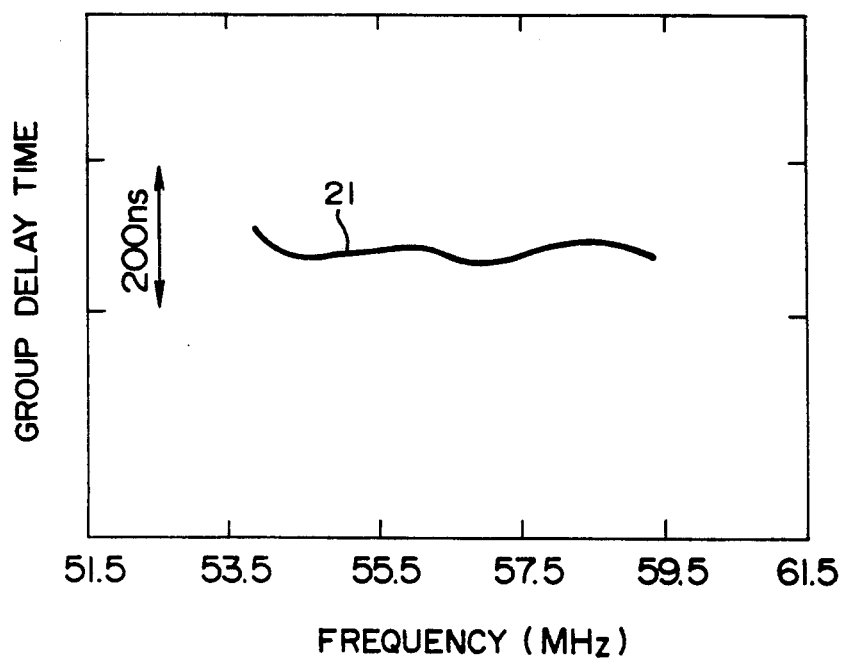
FIG. 12 is a diagram of the frequency-group delay characteristic of the sixth embodiment.

FIG. 11 schematically shows the surface acoustic wave apparatus of the sixth embodiment. Relative to the output (input) interdigital transducer 2 is provided an input (output) interdigital transducer 18, which is provided at one end with a split connection type interdigital transducer reflector 19 of 0.5 pair exciting source. For a high reflection coefficient, the capacitance of the transducer strips is cancelled out by an inductance element 20. Thus, the interdigital transducer type reflector even with a small number of pairs is effective to assure a flat group delay time because a high reflection coefficient can be obtained. As another means for the completely reflecting surface it can be considered to use the end surface of the substrate, but the above means seems more effective from the viewpoint of problems with the working precision, chipping and so on. In FIG. 12, a solid line 21 shows the frequency-group delay time characteristic of the sixth embodiment. From FIG. 12 it will be seen that the flatness of the characteristic over the frequency band is improved as compared with that of the fifth embodiment. Thus, the sixth embodiment can further improve the group delay characteristic.

Figure 13:
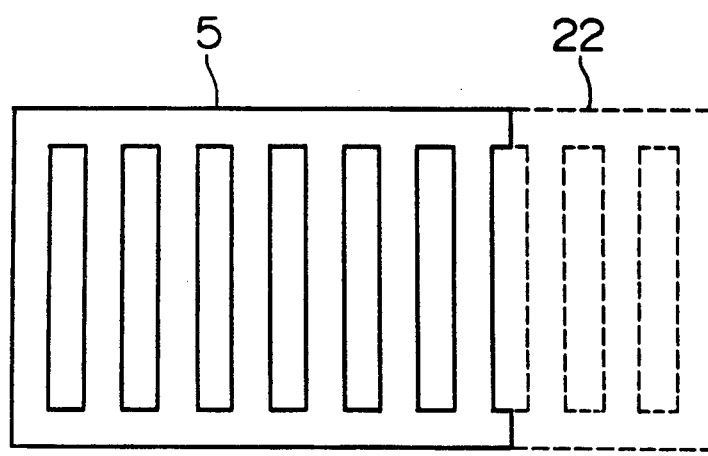
FIG. 13 is a diagram useful for explaining the method of producing the reflector of the seventh embodiment.

The seventh embodiment will be described with reference to FIG. 13. The above-mentioned reflector is used for improving the skirt characteristic at the ends of the filter frequency band. When the reflection coefficient of the reflector is too large or too small, the attenuation characteristic is not flat over the frequency band. When the phase of the reflected waves from the reflector is shifted from the optimum value, the Q value at frequencies other than desired frequencies is increased, thus degrading the skirt characteristic and the flatness of the attenuation characteristic within the frequency band. FIG. 13 shows a method of adjusting the reflection coefficient of the reflector in such case. In other words, more strips than are necessary for the reflector 5 are formed, a protective film such as a photoresist film is formed only on a portion of the strips which is necessary for the reflector 5 (and an unnecessary portion 22 of the strips is etched and trimmed from one end of the strips so that the unnecessary portion 22 is removed, thereby adjusting the reflection coefficient. According to this embodiment, it is possible to prevent the frequency characteristic from being deteriorated by the shift of the reflection characteristic, thus the yield being increased.

Figure 14:
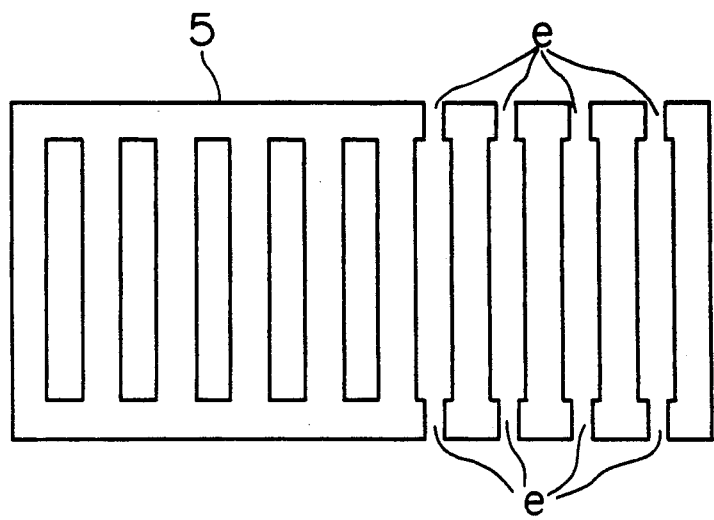
FIG. 14 is a diagram useful for explaining the method of producing the reflector of the eighth embodiment.

The eighth embodiment is concerned with the method of adjusting the phase of the reflected wave from the reflector. FIG. 14 shows a method of adjusting the reflector of the eighth embodiment. The reflector 5 is formed of shorted strips, and the shorting portions are sequentially cut at e by such trimming means as a laser cutter or an ultrasonic cutter to form open strips and thereby to adjust the phase of the reflected wave. This embodiment is effective to increase the yield.

Figure 15:
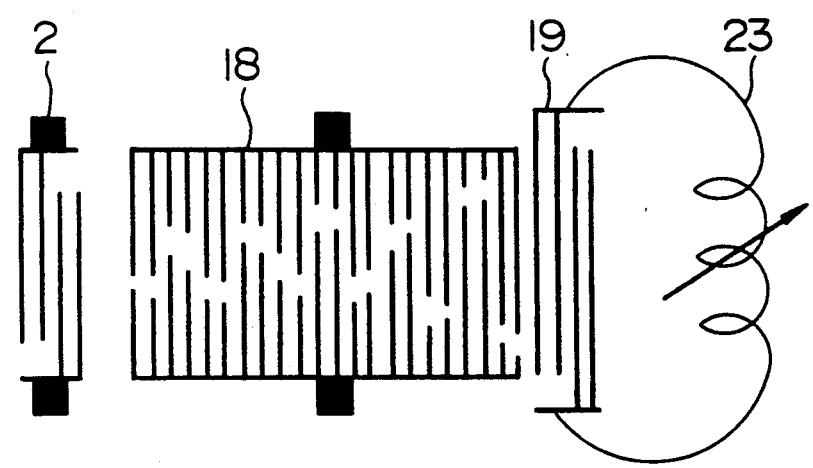
FIG. 15 is a diagram useful for explaining the method of adjusting the communication equipment using the surface acoustic wave apparatus of the ninth embodiment.

The ninth embodiment is concerned with a method of adjusting the frequency characteristic of communication equipment which employs in its circuits the surface acoustic wave apparatus having an interdigital transducer type reflector 19 according to this invention. FIG. 15 schematically shows the ninth embodiment. Relative to the output (input) interdigital transducer 2 are disposed an input (output) interdigital transducer 18 and the interdigital transducer type reflector 19, in turn. In addition, a variable inductance element 23 is disposed outside of the surface acoustic wave apparatus and is electrically connected to the interdigital transducer type reflector 19. The reflection characteristic of the interdigital transducer can be adjusted by changing the matching inductance value. Thus, after the surface acoustic wave apparatus of this invention is provided within the communication equipment, the value of the variable inductance is adjusted. According to this embodiment, the frequency characteristic can be adjusted with the surface acoustic wave apparatus incorporated in the communication equipment.

Figure 16:
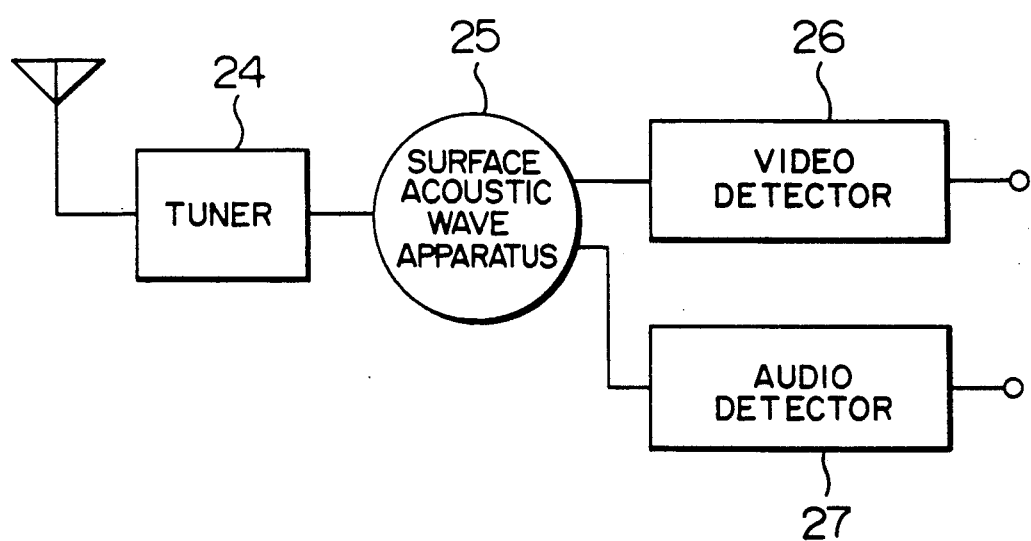
FIG. 16 is a block diagram of a television receiver of the tenth embodiment.

A further embodiment of the invention used in communication equipment will be described below. FIG. 16 is a block diagram of a television receiver to which the invention is applied as the tenth embodiment. The IF output of a tuner 24 is connected to a surface acoustic wave apparatus 25 of this invention and the output of the surface acoustic wave apparatus 25 is supplied to a video detection circuit 26 and to an audio detection circuit 27. The characteristic of the surface wave apparatus 25 is shown in FIG. 8. The resolution of the picture on the display can be increased by the increase of the chroma level, and no cross-color and 920 kHz beat can be removed by using the technique of this invention to reduce the audio level.

Figure 17:
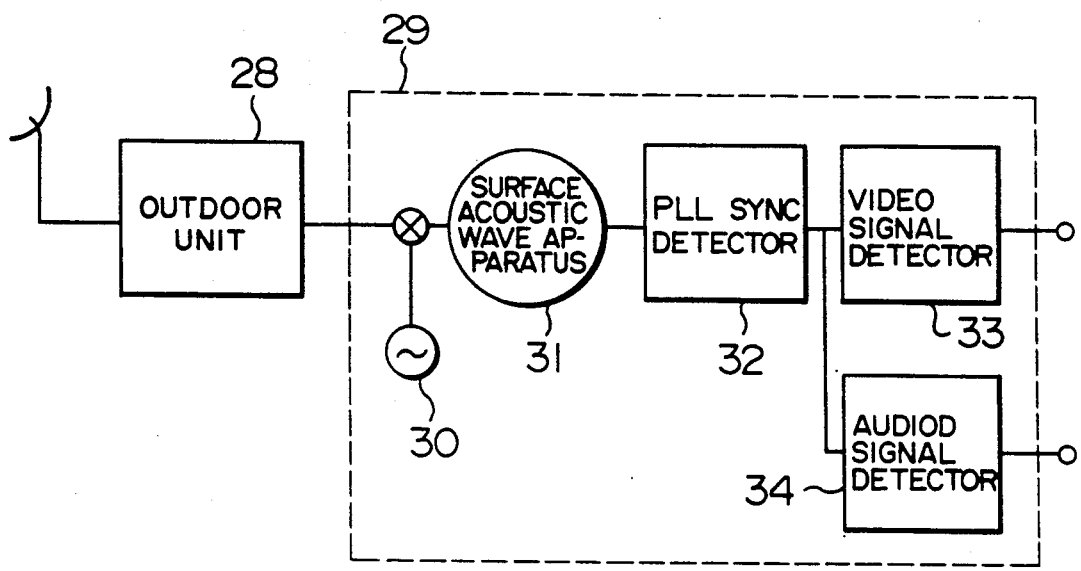
FIG. 17 is a block diagram of a satellite broadcast receiver of the eleventh embodiment.

The eleventh embodiment will be described with reference to FIGS. 17 and 18. FIG. 17 is a block diagram of a satellite broadcast receiver as the eleventh embodiment. A signal converted into a lower frequency through an outdoor unit 28 is supplied through a cable to an indoor unit 29. In the indoor unit 29, it is further converted into a lower frequency by mixing with the oscillation signal from an oscillator 30. This converted signal is supplied to a second IF filter, which is a surface acoustic wave apparatus 31 of this invention. The signal passed through the second IF filter is detected by a PLL synchronous detection circuit 32, the output of which is then supplied to a video signal processing circuit 33 and to an audio signal processing circuit 34.

Figure 18:
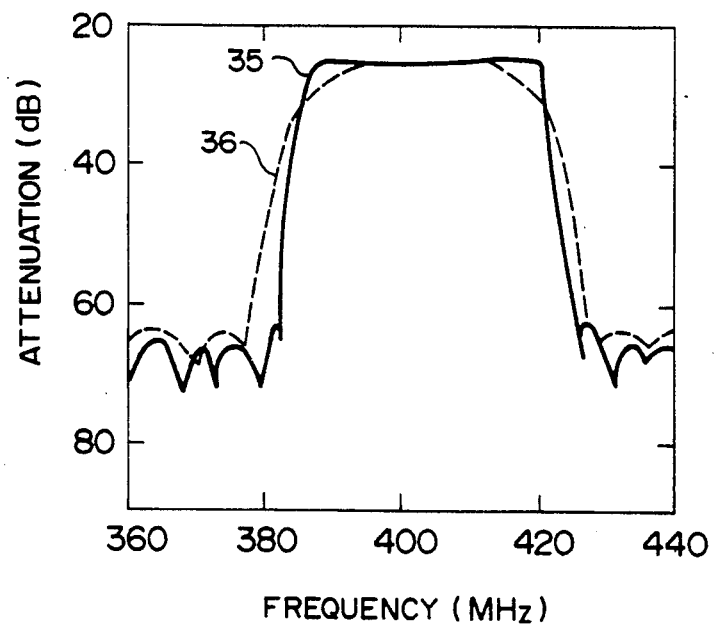
FIG. 18 is a diagram of the frequency-attenuation characteristic of the surface acoustic wave filter of the eleventh embodiment.

FIG. 18 shows the frequency-attenuation characteristic of the second IF filter of the eleventh embodiment. The broken line 36 shows the characteristic curve of the conventional surface acoustic wave apparatus, and the solid line 35 the characteristic curve of the surface acoustic wave apparatus of this invention. Since the characteristic of the apparatus of this invention faithfully reproduces the signal frequency band, the signal is not distorted, and the differential gain characteristic (DG) and the differential phase characteristic (DP) are improved. Also, since the skirt portions of the curve at the ends of the frequency band are steep, the amount of noise in that area is reduced with the result that the S/N ratio can be increased.

Thus, according to this invention, a wide band filter with a steep skirt characteristic an excellent sidelobe characteristic can be obtained without increasing the chip size and without reducing the aperture length of the interdigital transducer, which results in a cost of the apparatus.

We claim:

1. A surface acoustic wave apparatus having formed on a substrate an input interdigital transducer, an output interdigital transducer, at least one reflector for enhancing a skirt characteristic of the surface acoustic wave apparatus by reflecting a surface acoustic wave generated by applying a high-frequency voltage to said input interdigital transducer, and an inductance element connected to said at least one reflector, wherein said at least one reflector is provided on at least one side of at least one of said input interdigital transducer and said output interdigital transducer, wherein said at least one reflector is an interdigital transducer type reflector, and wherein said inductance element has a variable inductance.

2. A surface acoustic wave apparatus having formed on a substrate an input interdigital transducer, an output interdigital transducer, and at least one reflector for reflecting a surface acoustic wave generated by applying a high-frequency voltage to said input interdigital transducer, wherein said at least one reflector is provided on at least one side of at least one of said input interdigital transducer and said output interdigital transducer, and wherein said at least one reflector and at least one of said interdigital transducers are constructed to satisfy the following expression:

$$r_b = \frac{1 - 3r_a^2 - \sqrt{32r_a^6 - 39r_a^4 - 10r_a^2 + 1}}{4r_a(2r_a^2 - 1)}$$

where $r_a$ is a reflection coefficient of said at least one reflector and $r_b$ is a reflection coefficient of said at least one of said interdigital transducers, and wherein a center-to-center distance between an end strip of said at least one of the interdigital transducers and an end strip of said at least one reflector is set to be $$\frac{1}{4}\lambda + \frac{n}{2}\lambda,$$

where $\lambda$ is the wavelength of the surface acoustic wave at a center frequency of said surface acoustic wave apparatus, and n is a natural number.

3. A surface acoustic wave apparatus having formed on a substrate an input interdigital transducer, an output interdigital transducer, at least one reflector for enhancing a skirt characteristic of the surface acoustic wave apparatus by reflecting a surface acoustic wave generated by applying a high-frequency voltage to said input interdigital transducer, and an inductance element connected to said at least one reflector, wherein said at least one reflector is provided on at least one side of at least one of said input interdigital transducer and said output interdigital transducer, wherein said at least one reflector is an interdigital transducer type reflector, wherein said at least one of said interdigital transducers includes overlapping transducer strips which provide an asymmetrical weighting with respect to a propagation direction of the surface acoustic wave, and wherein said interdigital transducer type reflector includes a pair of transducer strips to which different voltages are to be applied.

4. A surface acoustic wave apparatus according to claim 2, wherein said at least one of said interdigital transducers includes overlapping transducer strips which provide an asymmetrical weighting with respect to a propagation direction of the surface acoustic wave.

5. A surface acoustic wave apparatus according to claim 2, wherein a plurality of basic units of structure each comprising said at least one of said interdigital transducers and said at least one reflector are provided along a propagation path of the surface acoustic wave and all of said at least one of said interdigital transducers of said plurality of basic units are electrically connected in parallel.

6. A surface acoustic wave apparatus according to claim 5, wherein $r_b \approx 2r_a$ is satisfied.

7. A surface acoustic wave apparatus according to claim 6, wherein said at least one of said interdigital transducers is constructed to be a solid-type transducer formed of two transducer strips, and wherein said at least one reflector is formed of a single transducer strip of the same width as the width of the strips of said at least one of said interdigital transducers.

* * * * *